(12) United States Patent
Kuchiki et al.

(10) Patent No.: US 11,806,805 B2
(45) Date of Patent: Nov. 7, 2023

(54) WORKPIECE CUTTING METHOD

(71) Applicants: Kyoritsu Chemical & Co., Ltd., Tokyo (JP); HAMAMATSU PHOTONICS K.K., Hamamatsu (JP)

(72) Inventors: Mikiharu Kuchiki, Tokyo (JP); Hidefumi Kinda, Tokyo (JP); Daisuke Kurita, Tokyo (JP); Takeshi Sakamoto, Hamamatsu (JP); Takafumi Ogiwara, Hamamatsu (JP); Yuta Kondoh, Hamamatsu (JP); Naoki Uchiyama, Hamamatsu (JP)

(73) Assignees: Kyoritsu Chemical & Co., Ltd., Tokyo (JP); HAMAMATSU PHOTONICS K.K., Hamamatsu (JP)

( * ) Notice: Subject to any disclaimer, the term of this patent is extended or adjusted under 35 U.S.C. 154(b) by 405 days.

(21) Appl. No.: 16/614,882

(22) PCT Filed: May 17, 2018

(86) PCT No.: PCT/JP2018/019171
§ 371 (c)(1),
(2) Date: Nov. 19, 2019

(87) PCT Pub. No.: WO2018/216600
PCT Pub. Date: Nov. 29, 2018

(65) Prior Publication Data
US 2020/0180075 A1 Jun. 11, 2020

(30) Foreign Application Priority Data
May 24, 2017 (JP) ................................ 2017-102743

(51) Int. Cl.
*B23K 26/16* (2006.01)
*B23K 26/40* (2014.01)
(Continued)

(52) U.S. Cl.
CPC .............. *B23K 26/16* (2013.01); *B23K 26/40* (2013.01); *B23K 26/53* (2015.10); *H01L 21/50* (2013.01);
(Continued)

(58) Field of Classification Search
CPC ............ B23K 2101/40; B23K 2103/50; B23K 26/40; B23K 26/53; B23K 20/023;
(Continued)

(56) References Cited

U.S. PATENT DOCUMENTS 8,703,601 B2 * 4/2014 Ikushima ............... H01L 24/743
264/263
2004/0002199 A1 * 1/2004 Fukuyo ................ B23K 26/032
438/106

(Continued)

FOREIGN PATENT DOCUMENTS

CN 1758986 A 4/2006
CN 104584195 A 4/2015
(Continued)

OTHER PUBLICATIONS

International Preliminary Report on Patentability dated Dec. 5, 2019 for PCT/JP2018/019171.

*Primary Examiner* — Chris Q Liu
(74) *Attorney, Agent, or Firm* — Faegre Drinker Biddle & Reath LLP (57) ABSTRACT

A object cutting method includes a first step of attaching an expandable sheet to a front surface or a back surface of a object, a second step of irradiating the object with a laser light along a line to cut to form a modified region, and expanding the expandable sheet to divide at least a part of the object into a plurality of chips and to form a gap that exists between the chips and extends to a side surface crossing the front surface and the back surface of the object, (Continued)

a third step of, after the second step, filling the gap with a resin from an outer edge portion including the side surface of the object, a fourth step of, after the third step, curing and shrinking the resin, and a fifth step of, after the fourth step, taking out the chips from the expandable sheet.

11 Claims, 12 Drawing Sheets

(51) Int. Cl.
  *H01L 21/50*   (2006.01)
  *H01L 21/67*   (2006.01)
  *H01L 21/78*   (2006.01)
  *B23K 101/40*   (2006.01)
  *B23K 26/53*   (2014.01)

(52) U.S. Cl.
  CPC ........ *H01L 21/67092* (2013.01); *H01L 21/78* (2013.01); *B23K 2101/40* (2018.08)

(58) Field of Classification Search
  CPC ...... B23K 20/16; B23K 20/233; B23K 20/26; B23K 26/03; B23K 26/032; B23K 26/034; B23K 26/046; B23K 26/0624; B23K 26/066; B23K 26/073; B23K 26/0853; B23K 26/16; B23K 26/364; B23K 26/00; B23K 2101/00; B23K 26/0617; B23K 26/0622; B23K 26/38; B23K 26/0676; B23K 26/009; B23K 26/04; B23K 26/0884; B23K 26/18; B23K 26/60; H01L 21/00; H01L 21/70; H01L 21/67; H01L 21/561; H01L 21/6835; H01L 21/78; H01L 21/6836; H01L 21/67132; H01L 21/268; H01L 21/304; H01L 21/67092; H01L 21/76894; H01L 21/76898; H01L 21/76; H01L 21/563; H01L 21/56; H01L 21/48; H01L 21/30604; H01L 21/3043; H01L 21/2633
  USPC .............. 219/121.67, 121.6, 121.61, 121.72, 219/121.73
  See application file for complete search history.

(56) References Cited

U.S. PATENT DOCUMENTS

| | | | |
|---|---|---|---|
| 2010/0136766 A1* | 6/2010 | Sakamoto | B23K 26/53 |
| | | | 257/E21.599 |
| 2011/0306182 A1* | 12/2011 | Fukuyo | B23K 26/40 |
| | | | 438/460 |
| 2012/0313276 A1 | 12/2012 | Ikushima | |

FOREIGN PATENT DOCUMENTS

| | | |
|---|---|---|
| DE | 102006054073 A1 | 5/2007 |
| JP | H02-127004 A | 5/1990 |
| JP | 2638155 B2 | 8/1997 |
| JP | 2003-338467 A | 11/2003 |
| JP | 2004-253628 A | 9/2004 |
| JP | 2004-268104 A | 9/2004 |
| JP | 2007-142206 A | 6/2007 |
| JP | 2007-165855 A | 6/2007 |
| JP | 2008-172242 A | 7/2008 |
| JP | 2009-88341 A | 4/2009 |
| JP | 2012-156341 A | 8/2012 |
| JP | 2013-222936 A | 10/2013 |
| JP | 2014-63813 A | 4/2014 |
| JP | 5607843 B2 | 10/2014 |
| JP | 2016-1677 A | 1/2016 |
| JP | 2016-058510 A | 4/2016 |
| TW | 201448003 A | 12/2014 |
| TW | 201505745 A | 2/2015 |

* cited by examiner

WORKPIECE CUTTING METHOD

TECHNICAL FIELD

One aspect of the present invention relates to an object cutting method.

BACKGROUND ART

As a technique relating to a conventional object cutting method, Patent Literature 1 discloses a technique for removing electricity from material forming an object (material forming the object or material having formed the object) when stress is applied through a sheet to the object on which a modified region serving as a starting point of cutting is formed.

CITATION LIST

Patent Literature

Patent Literature 1: Japanese Unexamined Patent Publication No. 2007-142206

SUMMARY OF INVENTION

Technical Problem

With such an object cutting method described above, if particles remain on the cut surface of a chip, the particles can be peeled off from the cut surface of the chip in, for example, a subsequent transporting step or the like, and can adhere to functional elements or the like of the chip.

One aspect of the present invention has been made in view of such circumstances, and is to provide an object cutting method capable of removing particles remaining on a cut surface of a chip.

Solution to Problem

An object cutting method according to one aspect of the present invention includes a first step of attaching an expandable sheet to a front surface or a back surface of an object to be processed, a second step of, after the first step, irradiating the object with a laser light along a line to cut to form a modified region, and expanding the expandable sheet to divide at least a part of the object into a plurality of chips and to form a gap that exists between the chips and extends to a side surface crossing the front surface and the back surface of the object, a third step of, after the second step, filling the gap with a resin from an outer edge portion including the side surface of the object, a fourth step of, after the third step, curing and shrinking the resin, and a fifth step of, after the fourth step, taking out the chips from the expandable sheet.

With this object cutting method, an object to be processed is divided into a plurality of chips, a gap between the chips is filled with a resin, and then, the resin with which the gap has been filled is cured and shrunk. Thus, it is possible to attach particles remaining on cut surfaces of the chips to be taken out to the resin, and to remove the particles.

An object cutting method according to one aspect of the present invention includes a first step of attaching an expandable sheet to a front surface or a back surface of an object to be processed, a second step of, after the first step, irradiating the object with a laser light along a line to cut to form a modified region, and expanding the expandable sheet to divide at least a part of the object into a plurality of chips and to form a gap that exists between the chips and extends to a side surface crossing the front surface and the back surface of the object, a third step of, in the second step, after a resin is applied on the expandable sheet before the expanding the expandable sheet, filling the gap with the applied resin from an outer edge portion including the side surface of the object while the gap is being expanded by the expanding the expandable sheet, a fourth step of, after the third step, curing and shrinking the resin, and a fifth step of, after the fourth step, taking out the chips from the expandable sheet.

With this object cutting method, it is also possible to attach particles remaining on cut surfaces of the chips to be taken out to the resin, and to remove the particles.

In the object cutting method according to one aspect of the present invention, the third step may include applying the resin to at least a part of a periphery separated from the side surface of the object by a predetermined distance to fill the gap with the resin from the side surface. In the object cutting method according to one present invention, the third step may include applying the resin to at least a part of the outer edge portion of the object to fill the gap with the resin from the outer edge portion. In these cases, it is possible to effectively fill the gap with the resin.

In the object cutting method according to one aspect of the present invention, the third step may include moving a liquid application mechanism along an outer edge of the object while the liquid application mechanism is applying the resin. In this case, it is possible to concretely fill the gap with the resin.

In the object cutting method according to one aspect of the present invention, the fifth step may include leaving the cured resin on the expandable sheet simultaneously with the taking out the chips. In this case, it is possible to leave particles remaining on the cut surfaces of the chips on the expandable sheet together with the resin when the chips are taken out.

In the object cutting method according to one aspect of the present invention, the fifth step may include removing at least a part of the cured resin before the taking out the chips. In this case, it is possible to remove particles remaining on the cut surfaces of the chips together with the resin before the chips are taken out.

In the object cutting method according to one aspect of the present invention, the resin is an ultraviolet curable resin, and, the third step may include irradiating the resin with an ultraviolet ray to cure the resin and simultaneously irradiating the expandable sheet with the ultraviolet ray to reduce an adhesive strength of the expandable sheet. By reducing the adhesive strength of the expandable sheet by irradiation with an ultraviolet ray in this manner, it is possible to easily take out the chips from the expandable sheet thereafter.

Advantageous Effects of Invention

According to one aspect of the present invention, it is possible to provide an object cutting method capable of removing particles remaining on a cut surface of a chip.

DESCRIPTION OF EMBODIMENTS

Hereinafter, an embodiment will be described in detail with reference to the accompanying drawings. In the drawings, the same or equivalent elements are denoted by the same reference signs, and the overlapping description is omitted.

In an object cutting method according to an embodiment and a laser machining apparatus which performs the object cutting method, a modified region is formed on an object to be processed along a line to cut by condensing a laser light on the object. First, the formation of a modified region will be described with reference to FIGS. 1 to 6.

Figure 1:
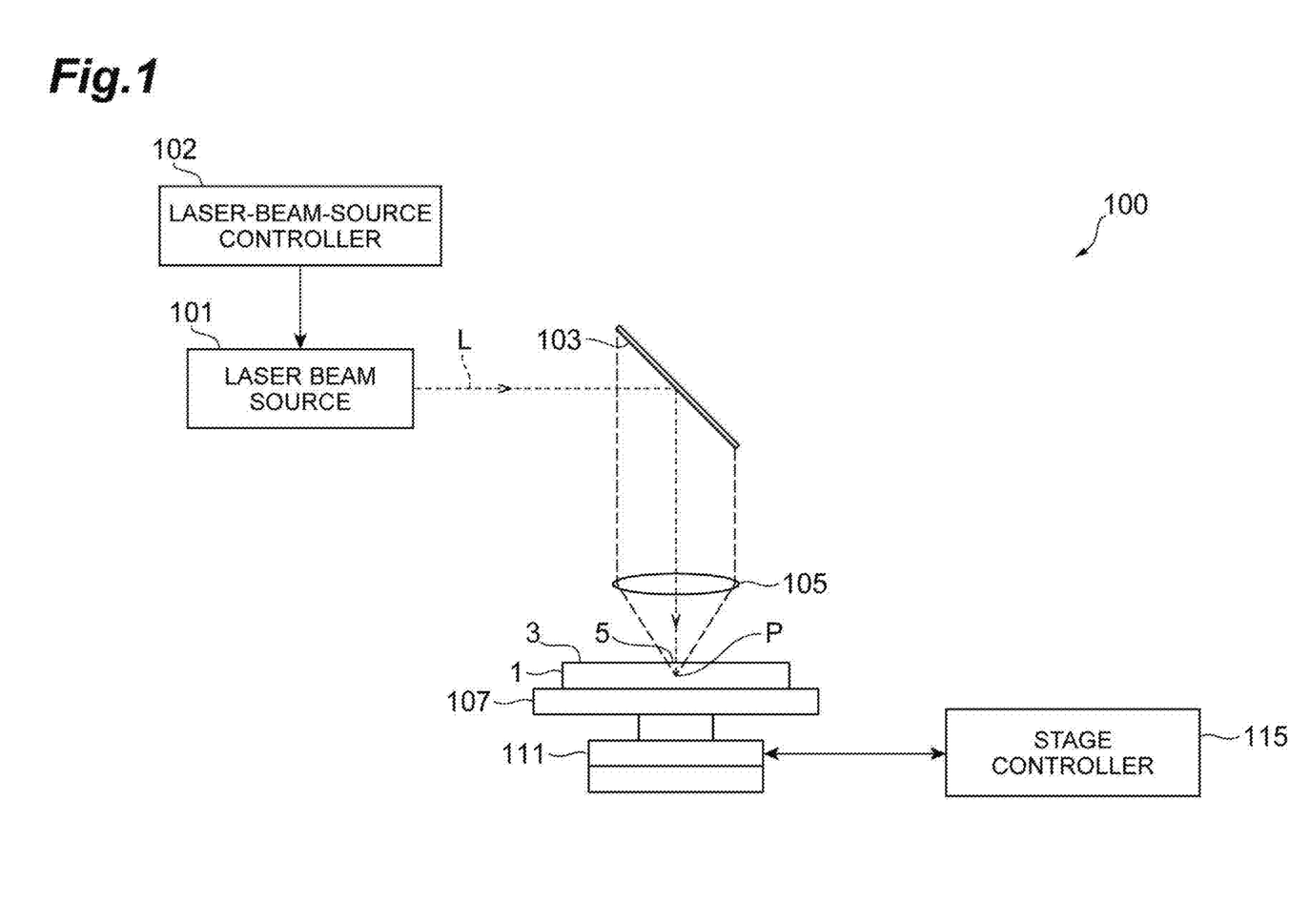
FIG. 1 is a schematic configuration diagram of a laser machining apparatus used for forming a modified region.

As shown in FIG. 1, a laser machining apparatus 100 includes a laser light source 101, a dichroic mirror 103, and a condensing lens 105. The laser light source 101 is a laser light emitting unit, and generates and pulsates a laser light L. The dichroic mirror 103 is disposed to change the direction of the optical axis (optical path) of the laser light L by 90°. The condensing lens 105 is used to condense the laser light L. The laser machining apparatus 100 further includes a support base 107, a stage 111, a laser-light-source controller 102, and a stage controller 115. The support base 107 is used to support an object to be processed 1 to be irradiated with the laser light L condensed by the condensing lens 105. The stage 111 is used to move the support base 107. The laser-light-source controller 102 controls the laser light source 101 to adjust the output (the pulse energy and the light intensity), the pulse width, the pulse waveform, and the like of the laser light L. The stage controller 115 controls the movement of the stage 111.

In the laser machining apparatus 100, the direction of the optical axis of the laser light L emitted from the laser light source 101 is changed by 90° by the dichroic mirror 103, and, then, the laser light L is condensed by the condensing lens 105 to the inside of the object 1 placed on the support base 107. At the same time, the stage 111 is moved to move the object 1 relative to the laser light L along a line to cut 5. Thus, a modified region along the line 5 is formed on the object 1. In this description, the stage 111 is moved in order to relatively move the laser light L, but the condensing lens 105 may be moved, or both of them may be moved.

Figure 2:
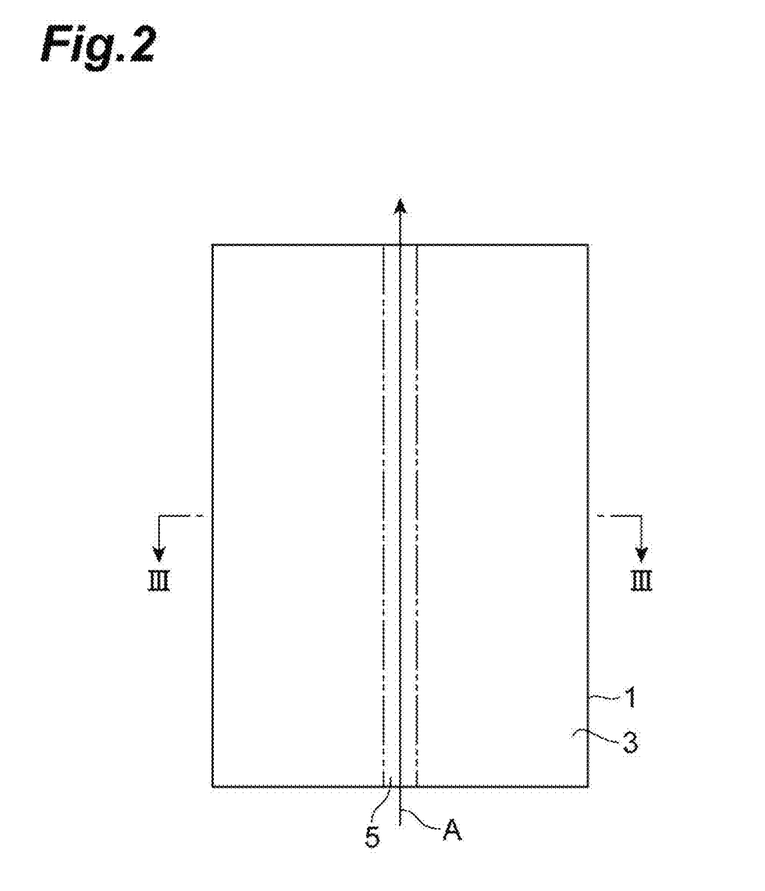
FIG. 2 is a plan view of a object to be used to form a modified region.
Figure 3:
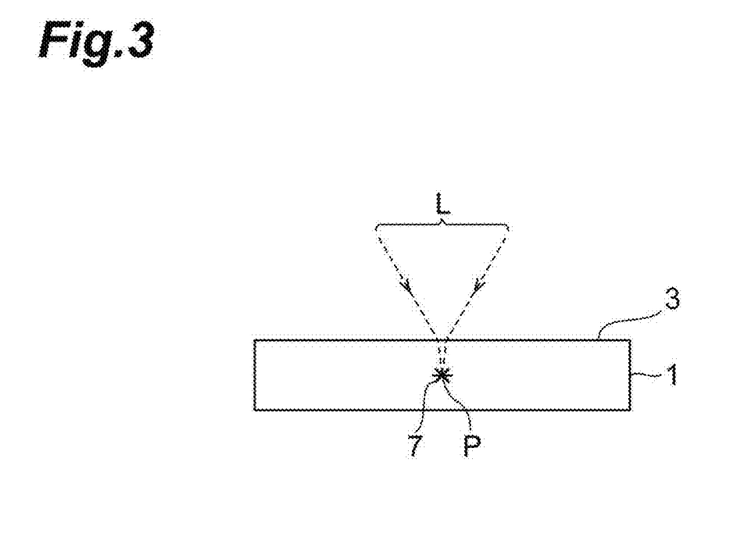
FIG. 3 is a cross-sectional view taken along the line of the object in FIG. 2.
Figure 4:
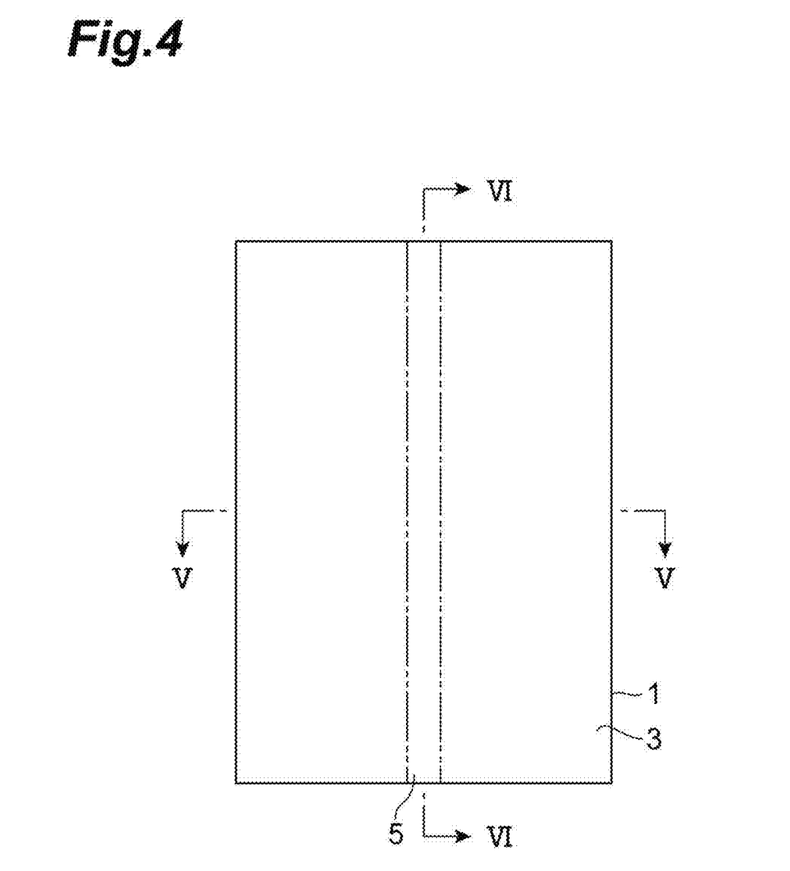
FIG. 4 is a plan view of the object after laser machining.
Figure 5:
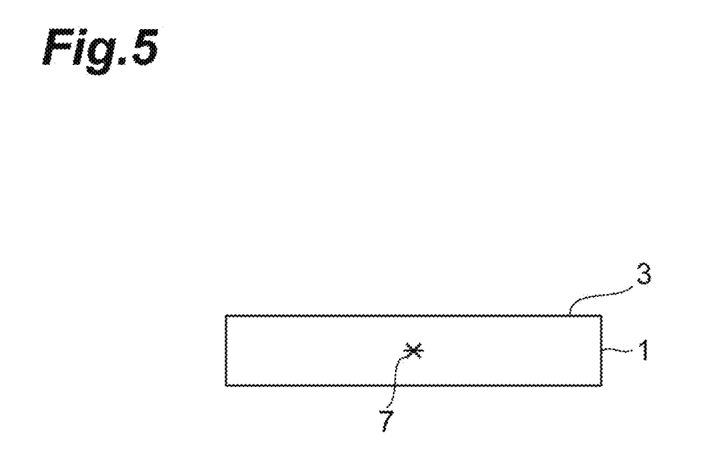
FIG. 5 is a cross-sectional view taken along the line V-V of the object in FIG. 4.
Figure 6:
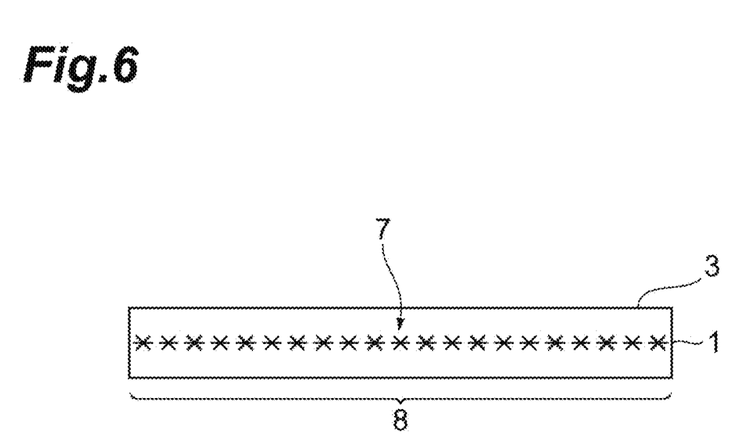
FIG. 6 is a cross-sectional view taken along the line VI-VI of the object in FIG. 4.

As the object 1, a plate-like member including a semiconductor substrate formed of a semiconductor material, a piezoelectric substrate formed of a piezoelectric material, or the like (for example, a substrate, a wafer, or the like) is used. As shown in FIG. 2, the line 5 for cutting the object 1 is set on the object 1. The line 5 is a virtual line extending linearly. When a modified region is formed inside the object 1, the laser light L is relatively moved along the line 5 (that is, in the direction of the arrow A in FIG. 2) while a condensing point (condensing position) P is being positioned inside the object 1 as shown in FIG. 3. Thus, as shown in FIGS. 4, 5, and 6, the modified region 7 is formed in the object 1 along the line 5, and the modified region 7 formed along the line 5 becomes a cutting start region 8.

The condensing point P is a point at which the laser light L is condensed. The line 5 is not limited to a straight line, and may be a curved line, a three-dimension shape obtained by combining these lines, or designated coordinates. The line 5 is not limited to a virtual line, and may be an actual line drawn on a front surface 3 of the object 1. The modified region 7 can be formed continuously or intermittently. The modified region 7 may be formed to be a line or a dot. In short, the modified region 7 is only required to be formed at least inside the object 1. Note that, a crack can be formed from the modified region 7, and the crack and the modified region 7 may be exposed on an outer surface (the front surface 3, a back surface, or an outer peripheral surface) of the object 1. The laser-light incident surface for forming the modified region 7 is not limited to the front surface 3 of the object 1, and may be the back surface of the object 1.

Incidentally, when the modified region 7 is formed inside the object 1, the laser light L passes through the object 1 and is absorbed especially in the vicinity of the condensing point P positioned inside the object 1. Thus, the modified region 7 is formed in the object 1 (that is, internal-absorption-type laser machining). In this case, since the laser light L is seldom absorbed on the front surface 3 of the object 1, the front surface 3 of the object 1 is not melted. On the other hand, when the modified region 7 is formed on the front surface 3 or the back surface of the object 1, the laser light L is absorbed especially in the vicinity of the condensing point P positioned on the front surface 3 or the back surface, and the object 1 is melted and removed from the front surface 3 or the back surface. Then, a removed portion, such as a hole or groove, is formed (surface-absorption-type laser machining).

The modified region 7 is a region in which the density, refractive index, mechanical strength, and other physical properties are different from its periphery. The modified region 7 includes, for example, a melting treatment region (meaning at least one of a region solidified after melted once, a region in a state of being melted, and a region in a state of being resolidified from melted), a crack region, a dielectric breakdown region, a refractive index changing region, and the like, and also includes a region in which these regions are mixed. The modified region 7 further includes a region in which the density of the material of the object 1 in the modified region 7 is changed compared to the density in a non-modified region, and a region in which lattice defects are formed. When the material of the object 1 is single crystal silicon, the modified region 7 can be said to be a high dislocation density region.

The melting treatment region, the refractive index changing region, the region in which the density in the modified region 7 is changed as compared to the density in a non-modified region, and the region in which lattice defects are formed can include cracks (chaps, microcracks) inside those regions or on the interface between the modified region 7 and the non-modified region. The included crack can be formed over the entire surface, at only a part, or at a plurality of parts of the modified region 7. The object 1 includes a substrate formed of a crystal material having a crystal structure. For example, the object 1 includes a substrate formed of at least one of gallium nitride (GaN), silicon (Si), silicon carbide (SiC), LiTaO$_3$, and sapphire (Al$_2$O$_3$). In other words, the object 1 includes, for example, a gallium nitride substrate, a silicon substrate, a SiC substrate, a LiTaO$_3$ substrate, or a sapphire substrate. The crystal material may be either an anisotropic crystal or an isotropic crystal. Furthermore, the object 1 may include a substrate formed of a noncrystalline material having a noncrystalline structure (amorphous structure), and include, for example, a glass substrate.

In the embodiment, it is possible to form the modified region 7 by forming a plurality of modified spots (machining traces) along the line 5. In this case, the modified region 7 is formed by gathering the plurality of modified spots. The modified spot is a modified portion formed by one pulse shot of a pulsed laser light (that is, one pulse of laser irradiation: a laser shot). The modified spot includes, for example, a crack spot, a melting treatment spot, a refractive index changing spot, or a mixture of at least one of them. Regarding the modified spot, by considering the required cutting accuracy, the required flatness of the cut surface, and the thickness, type, crystal orientation, and the like of the object 1, it is possible to appropriately control the size and length of a crack to be generated. In the embodiment, it is possible to form the modified spot as the modified region 7 along the line 5.

Next, a object cutting method will be described.

The object cutting method is used as a chip manufacturing method for laser-machining the object 1 to manufacture a plurality of chips. The object cutting method can be performed using the laser machining apparatus 100 shown in FIG. 1. The object 1 has, for example, a disk shape with a thickness of 400 μm and a diameter of 8 inches. The object 1 is, for example, a sapphire substrate, a SiC substrate, a glass substrate (tempered glass substrate), a silicon substrate, a semiconductor substrate, a transparent insulating substrate, or the like. The object 1 in this description is a single crystal silicon substrate.

A functional element layer is formed on the front surface 3, which is the laser-light incident surface, of the object 1. The functional element layer includes a plurality of functional elements (for example, a light receiving element such as a photodiode, a light emitting element such as a laser diode, or a circuit element formed as a circuit) arranged in a matrix. On the front surface 3 of the object 1, a plurality of lines to cut 5 extending so as to pass between adjacent functional elements is set. The lines 5 extend in a lattice shape.

Figure 7:
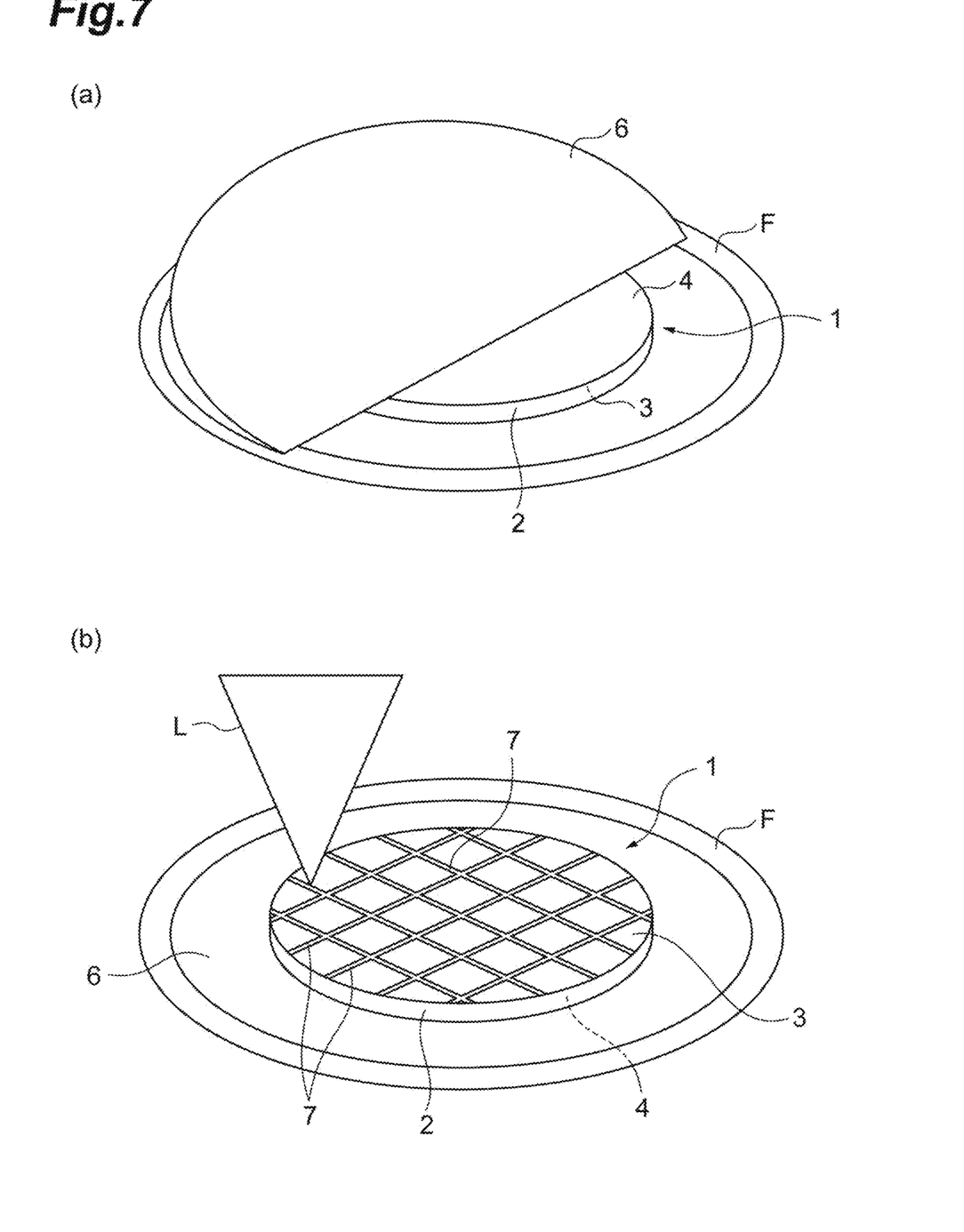
FIG. 7(a) is a schematic perspective view for explaining a object cutting method according to an embodiment.
FIG. 7(b) is a schematic perspective view following FIG. 7(a).

In the object cutting method, as shown in FIG. 7(a), first, an expandable tape (expandable sheet) 6 is attached to the back surface 4 of the object 1 (a tape attaching step: a first step). The expandable tape 6 is held by, for example, an annular frame F. In the tape attaching step, the object 1 is attached so that the back surface 4 is in contact with the expandable tape 6 held by the frame F. The expandable tape 6 is wider than the object 1 when viewed from the thickness direction of the object 1, and includes the object 1. The expandable tape 6 includes a central region in which the object 1 is disposed, and an outer edge region in which the object 1 is not disposed.

As shown in FIG. 7(b), while the condensing point P of the laser light L is being positioned on the object 1, the condensing point P is relatively moved along the line 5 (see FIG. 1) to form the modified region 7 at least inside the object 1 (a modified-region forming step: a second step). In the modified-region forming step, its machining conditions are not particularly limited as long as the object 1 can be divided into a plurality of chips 1a in a subsequent expanding step under the machining conditions. For example, a crack may be exposed on at least one of the front surface 3 and the back surface 4 of the object 1, or a crack may not be exposed.

Figure 8:
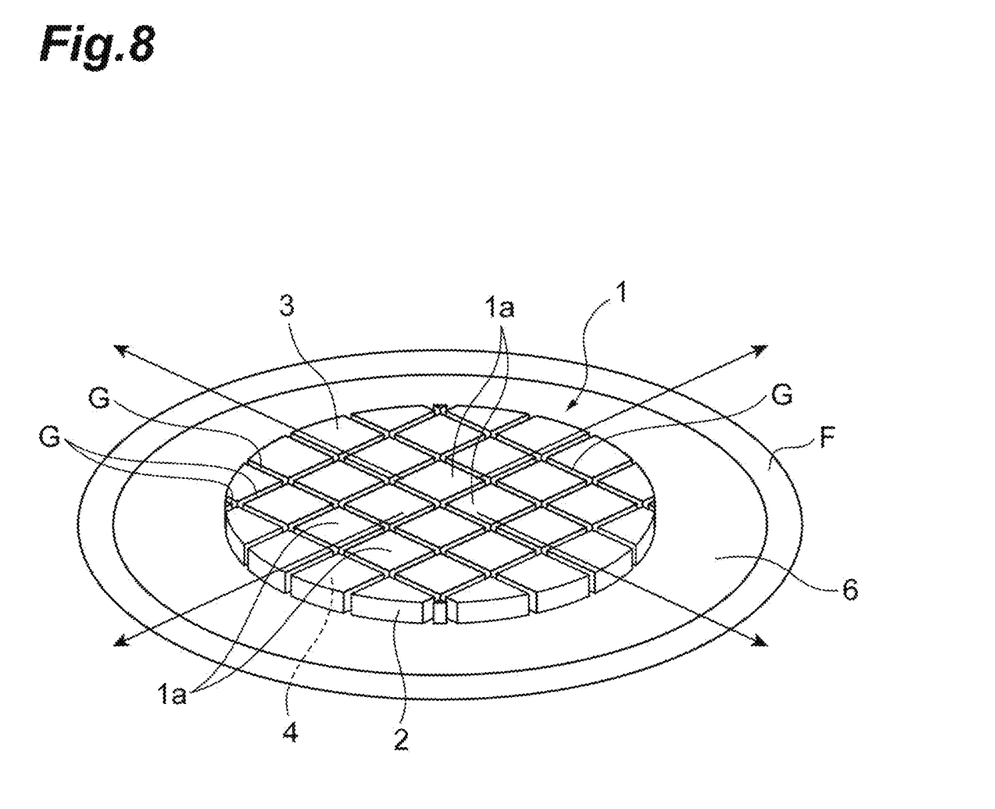
FIG. 8 is a schematic perspective view following FIG. 7(b).

As shown in FIG. 8, by expanding the expandable tape 6, for example, a crack 9 extending from the modified region 7 is stretched to divide the object 1 into a plurality of chips 1a. At the same time, a space between the chips 1a is expanded to form a gap G that exists between the chips 1a and extends to a side surface 2 orthogonal to (crossing) the front surface 3 and the back surface 4 of the object 1 (an expanding step: a second step). The gap G has a distance that allows a resin to be permeated in a subsequent resin filling step. The gap G is not particularly limited, and is, for example, 50 μm. Note that, the division into a plurality of chips 1a may be completed in the modified-region forming step, and, in this case, the expanding step is performed to secure the space between the chips 1a. In order to hold the object 1 after the expansion of the expandable tape 6, a grip ring, a heat shrink, or the like can be used.

Figure 9:
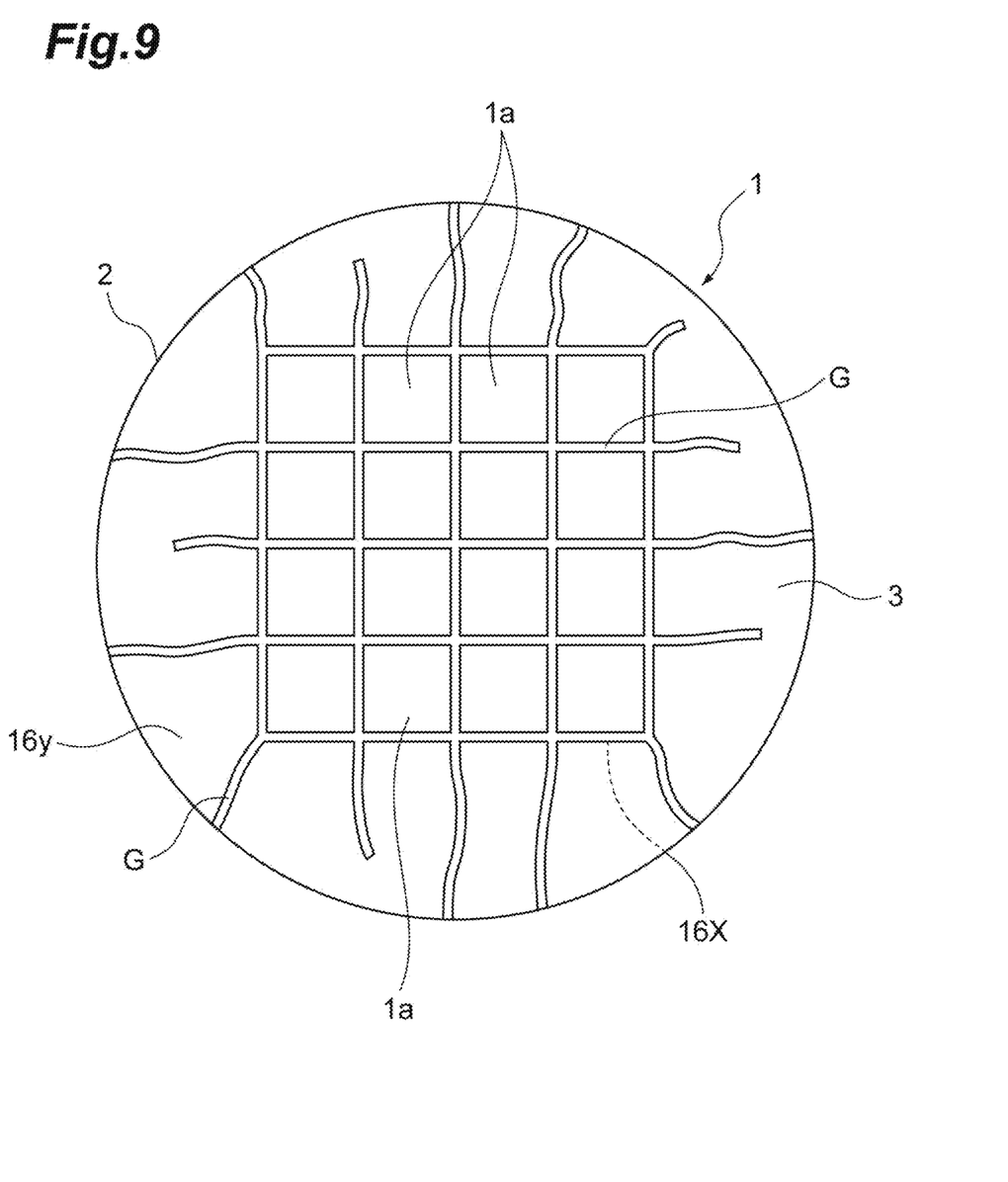
FIG. 9 is a plan view showing another example of the object after an expanding step.

Incidentally, as shown in FIG. 9, the object 1 can have a non-effective region 16x provided at the outer edge portion and an effective region 16y provided inside the non-effective region 16x. The effective region 16y is a region in which the functional element layer is provided, and the non-effective region 16x is a region in which the functional element layer is not provided. In this case, in the modified-region forming step, when the condensing point of the laser light L is positioned in the non-effective region 16x, the irradiation of the laser light L is turned off so as not to form the modified region 7. On the other hand, when the condensing point of the laser light L is positioned within the effective region 16y, the irradiation of the laser light L is turned on to form the modified region 7. In this case, after performing the expanding step, the effective region 16y of the object 1 is divided into a plurality of chips 1a, and at least a part of the gap G faulted between the chips 1a extends to the side surface 2 of the object 1 as shown in the drawing.

Figure 10:
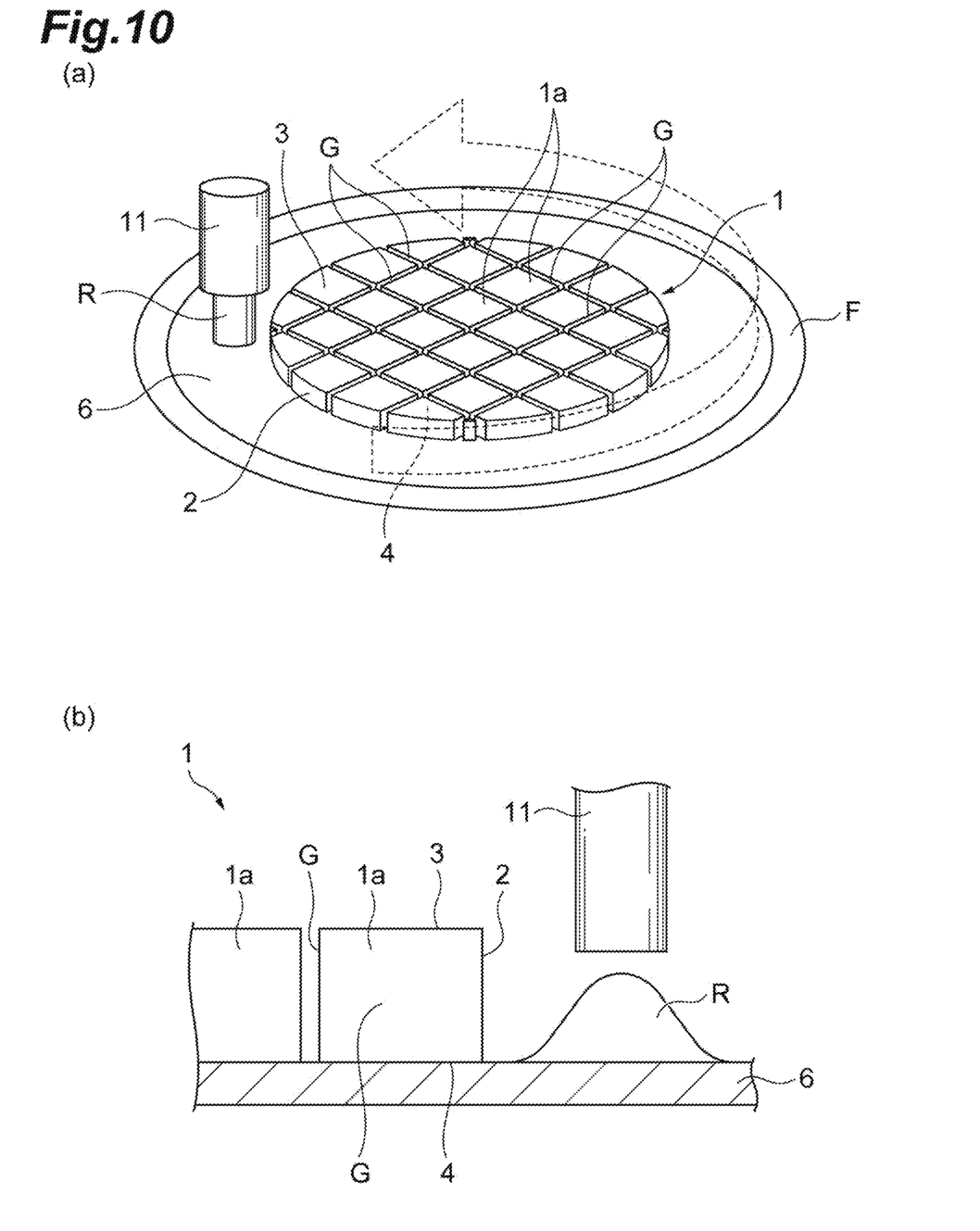
FIG. 10(a) is a schematic perspective view following FIG. 8.
FIG. 10(b) is an enlarged partial sectional view of FIG. 10(a).

As shown in FIGS. 10(a) and 10(b), the resin R is applied on the periphery separated from the side surface 2 of the object 1 by a predetermined distance to fill the gap G with the resin R from the side surface 2 of the object 1 (a resin filling step: a third step). In the resin filling step, a liquid application mechanism 11 is moved along the outer edge of the object 1 while the liquid application mechanism 11 is applying the resin R. Specifically, in the resin filling step, while the liquid application mechanism 11 is applying the resin R on a position separated from the side surface 2 of the object 1 by a predetermined distance, the liquid application mechanism 11 is moved around the object 1 multiple times (for example, twice).

In the resin filling step, the gap G is not directly filled with the resin R, but filled with the resin R dripped on the periphery of the object 1 placed on the expandable tape 6 flows through (permeates) the gap G due to at least one of capillary action, selective wettability of the side surface of the material, and surface tension. In the resin filling step, the resin R does not protrude from the front surface 3 of the object 1, and the resin R does not return through the gap G.

The resin R is a liquid resin. The resin R is an ultraviolet curable resin. As the resin R, a resin having a higher shrinkage rate during curing than a predetermined rate is selected so as to be easily peeled off from the chips 1a (see FIG. 11(b)) in a subsequent picking-up step. The resin R may be a gel, semi-solid, jelly, mousse, or paste (kneaded) resin. For example, the predetermined distance is 0.5 mm, and the height of the liquid application mechanism 11 from the expandable tape 6 is 0.3 mm. The resin reaches at least 350 μm of a plate thickness of 400 μm in the thickness direction of the object 1. The liquid application mechanism 11 in this description is a dispenser.

In the resin filling step, the liquid application mechanism 11 may be moved around the periphery of the object 1 only once. In the resin filling step, the liquid application mechanism 11 may be moved around the periphery of the object 1 only less than once. That is, in the resin filling step, the resin R may be applied to a part of the periphery separated from the side surface 2 of the object 1 by the predetermined distance. Alternatively, instead of or in addition to the movement of the liquid application mechanism 11, the stage 111 (see FIG. 1) on which the object 1 is placed may be rotated.

Figure 11:
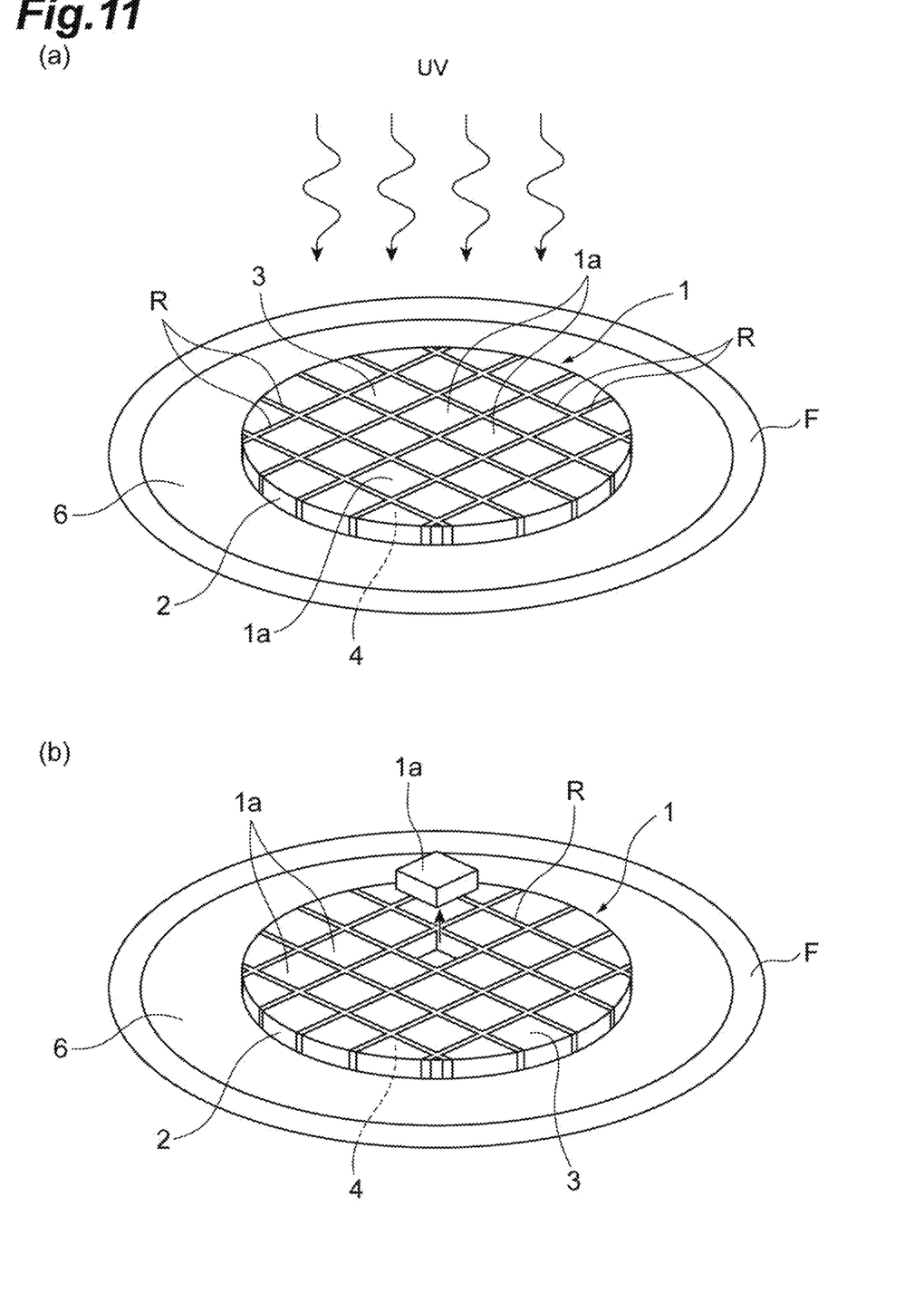
FIG. 11(a) is a schematic perspective view following FIG. 10(a).
FIG. 11(b) is a schematic perspective view following FIG. 11(a).

As shown in FIG. 11(a), the resin R is irradiated with an ultraviolet ray to cure and shrink the resin R (an ultraviolet-ray irradiating step: a fourth step). In the ultraviolet-ray irradiating step, the ultraviolet irradiation may be performed in a plurality of times or once. In the ultraviolet irradiation step, the expandable tape 6 is also irradiated with the ultraviolet ray to reduce the adhesive strength of the expandable tape 6 to the object 1.

As shown in FIG. 11(b), the chips 1a are picked up and taken out from the expandable tape 6 (a picking-up step: a fifth step). In the picking-up step, the cured resin R is peeled off from the side surfaces of the chips 1a, attached not to the chips 1a but to the expandable tape 6, and left on the expandable tape 6. Note that, the peeling of the resin R from the chips 1a may be performed by, instead of or in addition to the above picking-up, shrinkage of the resin R during the curing in the ultraviolet-ray irradiating step or re-expansion of the expandable tape 6 after the resin R is cured.

As described above, in the object cutting method, the object 1 is divided into a plurality of chips 1a, and the gap G between the chips 1a is filled with the resin R, and then the resin R with which the gap G has been filled is cured and shrunk. Thus, it is possible to attach particles remaining on the cut surfaces of the chips 1a to be taken out to the resin R, and to remove the particles. In addition, it is possible to suppress particles from being scattered on the front surface 3 of the object 1.

In the object cutting method, in the resin filling step, the resin R is applied to the periphery separated from the side surface 2 of the object 1 by the predetermined distance to fill the gap G with the resin R from the side surface 2. In this case, it is possible to effectively fill the gap G with the resin R.

In the object cutting method, in the resin filling step, the liquid application mechanism 11 is moved along the outer edge of the object 1 while the liquid application mechanism 11 is applying the resin R. In this case, it is possible to concretely fill the gap G with the resin R.

In the object cutting method, at the same time when the chips 1a are taken out, the cured resin R is left on the expandable tape 6. Thus, when the chips 1a are taken out, it is possible to leave particles remaining on the cut surfaces of the chips 1a on the expandable tape 6 together with the resin R.

In the object cutting method, at the same time when the resin R is irradiated with an ultraviolet ray to cure the resin, the expandable tape 6 is irradiated with the ultraviolet ray to reduce the adhesive strength of the expandable tape 6. In this manner, the irradiation of the ultraviolet ray cures the resin R and further reduces the adhesive strength of the expandable tape 6, and it is possible to easily pick up the chips 1a from the expandable tape 6 in the subsequent picking-up step.

Here, an evaluation experiment regarding selection of the resin R was conducted. As candidates for the resin R, a wax, a water-based resin, and an ultraviolet curable resin were used. As the wax, natural type, resin blend, and paraffin waxes were used. As the water-based resin, urethane-based, rubber-based, and acrylic-based resins were used. As the ultraviolet curable resin, acrylic and epoxy resins were used. In the evaluation experiment, the following properties were evaluated.

Permeability: Permeation into the gap G (viscosity 100 mPa·s or less)

Curability: High reactivity and deep curability

Peelability: Large cure shrinkage, low adhesion to the object 1, and high adhesion to the expandable tape 6.

As the result of the evaluation experiment, regarding the wax, permeability was x (unsuitable), and curability and peelability were ○ (suitable). Regarding the water-based resin, curability was x (unsuitable), and permeability and peelability were ○ (suitable). Regarding the ultraviolet curable resin, all the properties (permeability, curability, and peelability) were ○ (suitable). In particular, it was found that an acrylic ultraviolet curable resin having a viscosity of 100 mPa·s or less had the best properties.

The embodiment has been described as above, but one aspect of the present invention is not limited to the above embodiment, and can be modified or applied to another without departing the gist described in claims.

In the third step (resin filling step) in the above embodiment, by applying the resin R to at least a part of the outer edge portion including the side surface 2 of the object 1, instead of or in addition to applying the resin R to the periphery separated from the side surface 2 of the object 1 by the predetermined distance, the gap G may be filled with the resin R from the outer edge portion. The outer edge portion may be, for example, the non-effective region 16x (see FIG. 9) or an outer peripheral bevel region. In this case, it is also possible to effectively fill the gap G with the resin R.

In the above embodiment, the third step (resin filling step) can be performed during the second step. That is, in the second step, the resin R is applied on the expandable tape 6 before the expandable tape 6 is expanded, and, then, the gap G may be filled with the applied resin R from the side surface 2 of the object 1 while the gap G is being formed (grown) by expanding the expandable tape 6.

The position at which the resin R is applied before the expandable tape 6 is expanded may be the periphery separated from the side surface 2 of the object 1 by the predetermined distance or the outer edge portion of the object 1. In this case, it is also possible to attach particles remaining on the cut surfaces of the chips 1a to be taken out to the resin R, and to remove the particles.

In the above embodiment, the stage 111 or the ambient atmosphere may be heated during the third step or after the third step and before the fourth step. This makes it possible to lower the viscosity of the resin R, to accelerate the speed of filling the gap G with the resin R, and to increase the tact time. For example, when an object to be processed 1 having a thickness of 400 μm and a diameter of 8 inches was divided into 1.3 mm×1.4 mm chips 1a, it took 25 minutes to complete the filling with the resin R at normal temperature (when the stage 111 or the ambient atmosphere was not heated). On the other hand, when the stage 111 or the ambient atmosphere was heated at 40° C. for 5 minutes after normal temperature for 7 minutes, the filling with the resin R was completed. The temperature to be heated may be not more than a threshold value (for example, 60° C. or less) as an upper limit temperature at which the properties of the expandable tape 6 do not deteriorate. Thus, it is possible to suppress the deterioration of the properties of the expandable tape 6.

In the above embodiment, the liquid application mechanism 11 is not limited to a dispenser, and various application means may be used. The liquid application mechanism 11 may be, for example, a mechanism that applies the resin R by an inkjet method, a mechanism that applies the resin R by screen printing, or the like. When a mechanism that applying the resin R by screen printing is used as the liquid application mechanism 11, it is possible to circumferentially apply the resin R along the outer edge of the object 1 in a short time.

In the above embodiment, an ultraviolet curable resin using ultraviolet-ray curing has been used as the resin R, but the resin R is not particularly limited. For example, the resin R may be a resin using a curing reaction due to an external energy such as thermosetting, or a resin using normal-temperature reaction curing.

Figure 12:
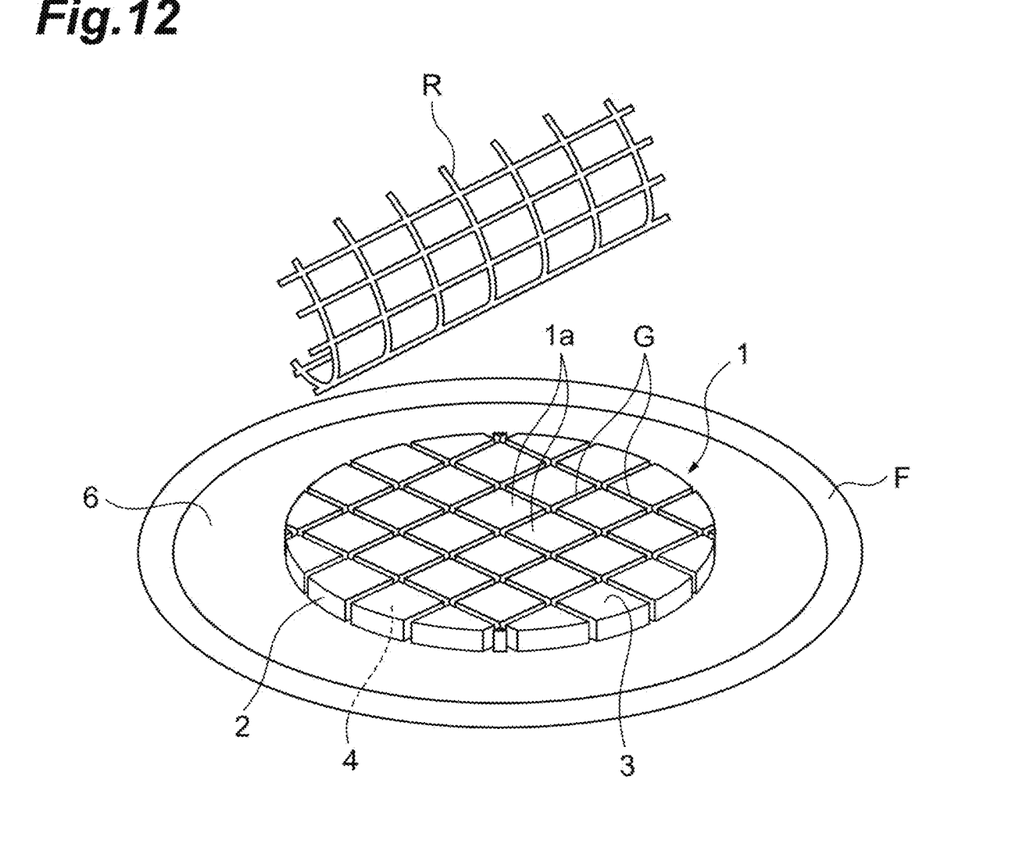
FIG. 12 is a schematic perspective view showing a resin peeling step of an object cutting method according to a modification.

In the above embodiment, in the picking-up step, at least a part of the cured resin R may be removed before the chips 1a are taken out as shown in FIG. 12. In this case, it is possible to remove particles remaining on the cut surfaces of the chips 1a together with the resin R before the chips 1a are taken out.

In the above embodiment, the expandable tape 6 has been used as an expandable sheet in order to divide the object 1 into the chips 1a. However, the expandable sheet is not limited to the expandable tape 6, and various expandable sheet materials may be used. In the expanding step, for example, a knife edge, a breaker device, a roller device, or the like may be further used. In the above description, "curing" includes a state of not being completely solidified. Curing is only required to solidify at least a part of a liquid resin R, and the resin R is shrunk by curing. The cured resin R may include at least one of a gaseous (gas) resin R and a resin R that remains liquid.

REFERENCE SIGNS LIST 1 object
1a Chip
2 Side surface
3 Front surface
4 Back surface
5 Line to cut
6 Expandable tape (expandable sheet)
7 Modified region
11 Liquid application mechanism
G Gap
L Laser light
R Resin

The invention claimed is:

1. An object cutting method comprising:
    a first step of attaching an expandable sheet to a first surface of an object to be processed, wherein the first surface is either one of a front surface or a back surface of the object;
    a second step of, after the first step, irradiating the object with a laser light along a line to cut to form a modified region, and expanding the expandable sheet to divide at least a part of the object into a plurality of chips and to form a gap that exists between the chips and extends to a side surface crossing the front surface and the back surface of the object;
    a third step of, after the second step, filling the gap with a resin by dripping the resin along an outer edge portion including the side surface of the object, so that the resin flows through the gap and does not protrude from a second surface of the object, wherein the second surface is either one of the front surface or the back surface to which the expandable sheet is not attached in the first step;
    a fourth step of, after the third step, curing and shrinking the resin such that the resin is configured to peel from the chips; and
    a fifth step of, after the fourth step, taking out the chips from the expandable sheet.

2. The object cutting method according to claim 1, wherein the third step includes applying the resin to at least a part of a periphery separated from the side surface of the object by a predetermined distance to fill the gap with the resin from the side surface.

3. The object cutting method according to claim 2, wherein the fifth step includes leaving the cured resin on the expandable sheet simultaneously with the taking out the chips.

4. The object cutting method according to claim 2, wherein
    the resin is an ultraviolet curable resin, and
    the third step includes irradiating the resin with an ultraviolet ray to cure the resin and simultaneously irradiating the expandable sheet with the ultraviolet ray to reduce an adhesive strength of the expandable sheet.

5. The object cutting method according to claim 1, wherein the third step includes moving a liquid application mechanism along an outer edge of the object while the liquid application mechanism is applying the resin.

6. The object cutting method according to claim 5, wherein the fifth step includes leaving the cured resin on the expandable sheet simultaneously with the taking out the chips.

7. The object cutting method according to claim 5, wherein
    the resin is an ultraviolet curable resin, and
    the third step includes irradiating the resin with an ultraviolet ray to cure the resin and simultaneously irradiating the expandable sheet with the ultraviolet ray to reduce an adhesive strength of the expandable sheet.

8. The object cutting method according to claim 1, wherein the fifth step includes leaving the cured resin on the expandable sheet simultaneously with the taking out the chips.

9. The object cutting method according to claim 8, wherein
    the resin is an ultraviolet curable resin, and
    the third step includes irradiating the resin with an ultraviolet ray to cure the resin and simultaneously irradiating the expandable sheet with the ultraviolet ray to reduce an adhesive strength of the expandable sheet.

10. The object cutting method according to claim 1, wherein the resin is an ultraviolet curable resin, and the third step includes irradiating the resin with an ultraviolet ray to cure the resin and simultaneously irradiating the expandable sheet with the ultraviolet ray to reduce an adhesive strength of the expandable sheet.

11. An object cutting method comprising:

a first step of attaching an expandable sheet to a first surface of an object to be processed, wherein the first surface is either one of a front surface or a back surface of the object;

a second step of, after the first step, irradiating the object with a laser light along a line to cut to form a modified region, and expanding the expandable sheet to divide at least a part of the object into a plurality of chips and to form a gap that exists between the chips and extends to a side surface crossing the front surface and the back surface of the object;

a third step of, after the second step, filling the gap with a resin by dripping the resin along an outer edge portion including the side surface of the object, so that the resin flows through the gap and does not protrude from a second surface of the object, wherein the second surface is either one of the front surface or the back surface to which the expandable sheet is not attached in the first step;

a fourth step of, after the third step, curing and shrinking the resin; and a fifth step of, after the fourth step, taking out the chips from the expandable sheet and peeling the cured resin from a side surface of the chips taken out from the expandable sheet.

\* \* \* \* \*